(12) United States Patent
Keenihan et al.

(10) Patent No.: US 10,432,134 B2
(45) Date of Patent: Oct. 1, 2019

(54) SUPPORT STRUCTURE FOR SOLAR MODULE

(71) Applicant: DOW GLOBAL TECHNOLOGIES LLC, Midland, MI (US)

(72) Inventors: James R. Keenihan, Midland, MI (US); Leonardo C. Lopez, Midland, MI (US); Kwanho Yang, Midland, MI (US); Joseph A. Langmaid, Caro, MI (US)

(73) Assignee: DOW GLOBAL TECHNOLOGIES LLC, Midland, MI (US)

( * ) Notice: Subject to any disclaimer, the term of this patent is extended or adjusted under 35 U.S.C. 154(b) by 217 days.

(21) Appl. No.: 14/786,083

(22) PCT Filed: Apr. 7, 2014

(86) PCT No.: PCT/US2014/033137
§ 371 (c)(1),
(2) Date: Oct. 21, 2015

(87) PCT Pub. No.: WO2014/193542
PCT Pub. Date: Dec. 4, 2014

(65) Prior Publication Data
US 2016/0087575 A1    Mar. 24, 2016

Related U.S. Application Data

(60) Provisional application No. 61/829,680, filed on May 31, 2013.

(51) Int. Cl.
*H02S 20/25* (2014.01)
*H01L 31/048* (2014.01)

(52) U.S. Cl.
CPC .......... *H02S 20/25* (2014.12); *H01L 31/0481* (2013.01); *Y02B 10/12* (2013.01)

(58) Field of Classification Search
CPC .............. H02S 30/10; H02S 20/21–26; H01L 31/0481; H01L 31/049; F24J 2/045;
(Continued)

(56) References Cited

U.S. PATENT DOCUMENTS 2,168,218 A * 8/1939 Kirschbraun ............. E04D 1/22
52/560
4,611,090 A    9/1986 Catella et al.
(Continued)

FOREIGN PATENT DOCUMENTS

CA    2056867 A1    6/1992
CN    102844889    12/2012
(Continued)

OTHER PUBLICATIONS

Chinese Office Action dated Mar. 17, 2017 for Application No. 201480028389.9.
(Continued)

*Primary Examiner* — Eric R Smith

(57) ABSTRACT

A solar module (2) comprising; (a) an active portion (4) and (b) a support portion (6), wherein the support portion (8) includes a plurality of reinforcement ribs (20) in a series of interconnected or partially interconnected patterns. The solar module (2) may include an intermediate portion (6C) acting as a structural interface between the active portion (4) and the support portion (6). The intermediate portion (6C) may include one or more gate locations (10, 12). The plurality of reinforcement ribs (20) may extend at an angle along the support portion (6) so that an effective modulus of the support portion (6) along a width direction is substantially equal to an effective modulus of the support portion (6) along a length direction.

16 Claims, 7 Drawing Sheets

(58) Field of Classification Search
CPC .......... F24J 2/0455; F24J 2/5237; E04D 1/08;
B32B 3/12; B32B 2457/12; E04C 2/365
See application file for complete search history.

(56) References Cited

U.S. PATENT DOCUMENTS

| | | | |
|---|---|---|---|
| 5,437,735 | A | 8/1995 | Younan et al. |
| 6,051,774 | A | 4/2000 | Yoshida et al. |
| 6,106,752 | A | 8/2000 | Chang et al. |
| 6,119,415 | A | 9/2000 | Rinklake et al. |
| D572,843 | S | 7/2008 | Berry et al. |
| 7,870,691 | B2 | 1/2011 | Williams et al. |
| 7,985,919 | B1 | 7/2011 | Roscheisen et al. |
| 8,136,322 | B2 | 3/2012 | Shadwell et al. |
| 2006/0266405 | A1 | 11/2006 | Lenox |
| 2006/0266406 | A1 | 11/2006 | Faust et al. |
| 2008/0000174 | A1* | 1/2008 | Flaherty ................. E04D 1/08 52/173.3 |
| 2009/0000222 | A1* | 1/2009 | Kalkanoglu ............ E04D 1/20 52/173.3 |
| 2011/0030767 | A1* | 2/2011 | Ehbing .................. H02S 30/10 136/251 |
| 2011/0047894 | A1* | 3/2011 | Shadwell ............... E04D 1/205 52/105 |
| 2011/0100436 | A1* | 5/2011 | Cleereman ............. H01R 31/00 136/251 |
| 2011/0138710 | A1* | 6/2011 | Reisdorf ................. F24J 2/045 52/173.3 |
| 2011/0220183 | A1* | 9/2011 | Mills ...................... H01L 31/05 136/251 |
| 2011/0223372 | A1 | 9/2011 | Metz et al. |
| 2012/0210660 | A1 | 8/2012 | Livsey et al. |
| 2013/0042905 | A1 | 2/2013 | Stassen et al. |

FOREIGN PATENT DOCUMENTS

| | | | |
|---|---|---|---|
| CN | 102985628 | | 3/2013 |
| CN | 202968759 | | 6/2013 |
| EP | 0929389 | B1 | 11/2001 |
| JP | 2003-218375 | | 7/2003 |
| WO | 1998/012047 | A1 | 3/1998 |
| WO | 2012/082604 | A1 | 6/2012 |
| WO | 2012/096998 | A2 | 7/2012 |
| WO | 2012/135769 | A2 | 10/2012 |
| WO | 2013/074402 | A2 | 5/2013 |
| WO | WO 2013081477 | A1 * | 6/2013 ............... E04D 1/30 |

OTHER PUBLICATIONS

International Search Report and Written Opinion dated Sep. 7, 2014 for Application No. PCT/US2014/033137.
International Preliminary Report on Patentability dated Jun. 30, 2015 for Application No. PCT/US2014/033137.

* cited by examiner

SUPPORT STRUCTURE FOR SOLAR MODULE

STATEMENT OF GOVERNMENT RIGHTS

This invention was made at least in part with U.S. Government support under contact number DE-EE0005434 awarded by the Department of Energy. The U.S. Government has certain rights in this invention.

FIELD

The present teachings generally relate to an improved support structure that houses all or a portion of an active portion, forms a support portion for one or more adjacent solar modules, or both.

BACKGROUND

Typically, solar arrays are placed in an elevated location such as a roof top of a home or a building or in a rack and frame that elevates the solar array so that the solar array is exposed to sunlight. The roofs on homes and/or buildings generally are formed by adding a plurality of pieces of panels together so that a generally contiguous surface is formed, which are supported by one or more support beams. Solar modules may be secured to the plurality of pieces of panels directly and/or indirectly via a connection structure such as a rack and frame. Each solar module of the solar array may include only an active portion and the active portions of two or more solar modules may be placed in close proximity with one another so that a solar array is formed over and/or on the connection structure. However, in cases where the solar modules provide roofing functions, the solar modules may include both an active portion and a support portion and the active portion of one solar module may fully and/or partially cover the support portion of an adjacent solar module to replace the framing and racking structure. In cases of building integrated photovoltaics, the support portion may provide roofing functions or structural functions for subsequent photovoltaic modules. The support portion of the solar module may warp and/or curl after manufacture so that when the solar module is placed on a support structure the support portion does not form a flat connection with the support structure. Typically, as the size of the solar module is increased the size of the support portion increases, which results in an increase in the amount of warp that is experienced by each solar module, therefore, current solar modules may be limited in size to reduce the warp and/or curl of the solar module. Further, when the active portion is placed over the support portion, the support portion may not lay flat due to the warp of the support portion so that when mass is placed on the active portion, the active portion may be deformed and/or damaged due to the warp of the support portion placing an uneven amount of pressure on the active portion.

Additionally, the support structures of a roof may not have consistent flatness or strength due to variations in fabrication and/or age of the roof. At some point over the life of the solar array, the home owner, a repair person, an installer, or a combination thereof may be required to walk across the solar array. As the individual walks across the solar array, each individual solar module may bend and flex due to the variations in strength and/or flatness of the support structures, which may result in the solar module bending enough so that the solar module is damaged. The warp and/or curl of the support portion may exacerbate the bending of the solar module and/or form a pressure point. It would be attractive to have a solar module which is resistant to warping and/or curl, is sufficiently compliant to the irregularities of the roof support structure, and lies flat so that the active portion is supported by the support portion.

Examples of some known solar modules may be found in U.S. Pat. Nos. D572,843; 5,437,735; 6,106,752; 7,870,691; 7,985,919; U.S. Patent Application Publication No. 2006/0266405; 2006/0266406; 2012/0210660; Canadian Patent No. CA2056867; European Patent No. EP929389; and International Patent Application No. WO1998/012047; WO2012/082604; and WO2012/135769 all of which are incorporated by reference herein for all purposes.

It would be attractive to have a device that has a support portion that is substantially planar and free of any warped portions, curled portions, or both. If would be attractive to have a device that provides a uniform support surface to one or more active portions of one or more adjacent solar modules so that the active portions are substantially supported when a mass is applied to the solar module, or when the support structure deflects the support portion provides stability and flatness to the active portion. What is needed is a support portion of the solar module that provides the necessary structural properties to provide a uniform support structure for subsequent solar module's active portions and is easily manufactured with a polymeric construction having a thin, light, low cost, and dimensionally stable construction so that the solar module remains planar and is free of warp. What is needed is a support portion that remains free of warp and/or curl when the length, width, or both of the solar module is increased.

SUMMARY

The present teachings meet one or more of the present needs by providing: a solar module comprising: (a) an active portion and (b) a support portion, wherein the support portion and the active portion each comprise: (i) an upper surface, (ii) a lower surface, (iii) or both; wherein the upper surface or the lower surface of the support portion includes: a plurality of reinforcement ribs; and wherein the solar module includes one or more of the following: (A) the support portion includes an intermediate portion and an overlap support portion and the intermediate portion acts as a structural interface between the active portion and the support portion, and the intermediate portion includes one or more gate locations; (B) the plurality of reinforcement ribs extend at an angle along the support portion so that an effective modulus of the support portion along a width direction is substantially equal to an effective modulus of the support portion along a length direction; or (C) the active portion has a length that is measured from an edge proximate to the support portion to an opposing edge of the active portion and the overlap support portion and the intermediate portion have a length that is measured from an edge proximate to the active portion to an opposing edge of the overlap support portion, and the length of the overlap support portion plus the Intermediate portion is substantially the same or greater than the length of the active portion.

One possible embodiment of the present teachings include: a method of producing the support portion taught herein comprising: (a) injecting the polymeric composition at the one or more gate locations so that the polymeric composition spreads out and forms the support portion and (b) wherein the support portion forms a frame around the active portion.

Another possible embodiment of the present teachings includes: a solar array comprising: a plurality of the solar modules of the teachings herein, wherein the support portion of a solar module is covered by one or more adjacent solar modules.

The teachings herein surprisingly solve one or more of these problems by providing a device that has a support portion that is substantially planar and free of any warped portions, curled portions, or both. The teachings herein provide a device that provides a uniform support surface to one or more active portions of one or more adjacent solar modules so that the active portions are substantially supported when a mass is applied to the solar module, or when the support structure deflects the support portion provides stability and flatness to the active portion. The teachings herein provide a support portion of the solar module that provides the necessary structural properties to provide a uniform support structure for subsequent solar module's active portions and is easily manufactured with a polymeric construction having a thin, light, low cost, and dimensionally stable construction so that the solar module remains planar and is free of warp. The teachings herein provide a support portion that remains free of warp and/or curl when the length, width, or both of the solar module is increased.

DETAILED DESCRIPTION

Figure 1:
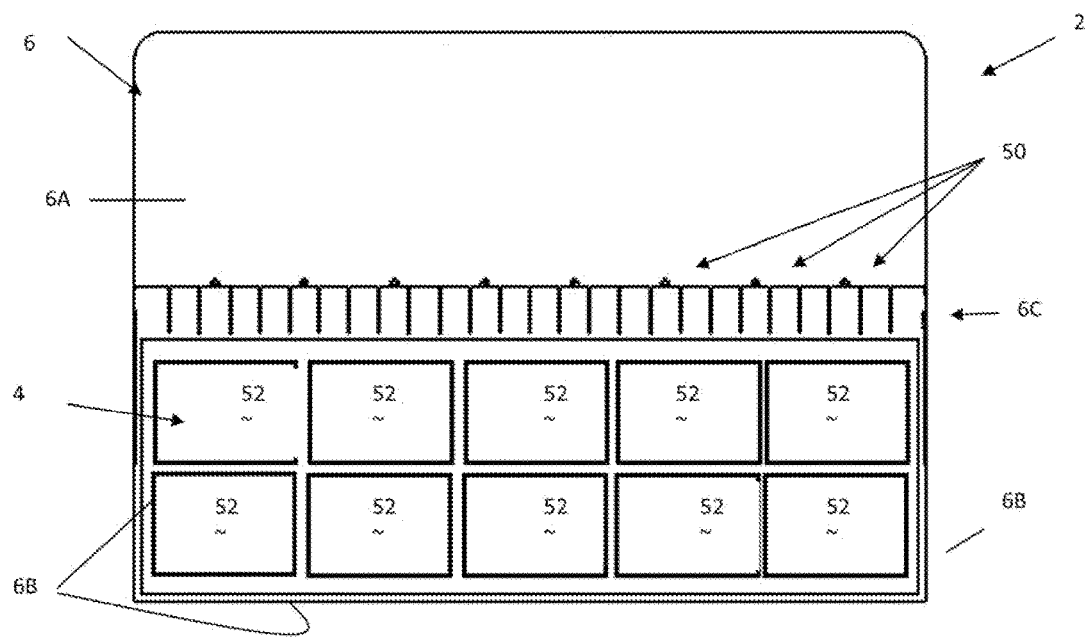
FIG. 1 illustrates a front view of a solar module.

The explanations and illustrations presented herein are intended to acquaint others skilled in the art with the teachings, its principles, and its practical application. Those skilled in the art may adapt and apply the teachings in its numerous forms, as may be best suited to the requirements of a particular use. Accordingly, the specific embodiments of the present teachings as set forth are not intended as being exhaustive or limiting of the teachings. The scope of the teachings should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. Other combinations are also possible as will be gleaned from the following claims, which are also hereby incorporated by reference into this written description.

The present teachings claim priority to U.S. Patent Application No. 61/829,680, filed on May 31, 2013, the teachings of which are incorporated in their entirety herein for all purposes. A plurality of solar modules of the teachings herein are combined together to form a solar array. The solar array collects sunlight and converts the sunlight to electricity. Generally, each of the solar modules may be individually placed in a structure that houses all of the solar modules forming all or a portion of a solar array. The solar modules of the teachings herein may be used with a housing that contains all of the individual solar modules that make up a solar array. Preferably, the solar array taught herein is free of a separate structure that houses all of the solar modules that make up a solar array (also referred to as a photovoltaic array). More preferably, each individual solar module may be connected directly to a structure (i.e., is a building integrated photovoltaic (BIPV) and each of the individual solar modules is electrically connected together so that a solar array is formed. Most preferably, each individual solar module may include a support portion and an active portion and the active portion may overlap all or a portion of one or more adjacent solar modules forming a "double overlap" so that each solar module may be protected and connected to a connection surface and/or so that the combined solar modules may form a shingle structure for diverting fluids from the roof of the structure. Each of the solar modules may have a portion that may be indirectly and/or directly connected to a connection surface. Preferably, the support portion of each of the solar modules may be directly connected to a connection surface, and the active portion may be connected directly to the support portion or directly to the connection surface by a fastener that extends through the support portion, around the support portion, through an intermediate portion, through a fastener support in the support portion, or a combination thereof.

The connection surface may be any surface that provides support to one or more solar modules so that a solar array is formed. The connection surface may be a support structure such as a housing for containing one or more of the solar modules. Preferably, when the solar module includes a support portion, the connection surface may be a roof. The roof may be made of any material that has sufficient strength to support the weight of the plurality of solar modules. The roof may be made of any material so that the plurality of solar modules may be directly connected to the roof. The roof may be comprised of a plurality of panels made of wood, plywood, structural plywood, decorative plywood, overlaid plywood, commercial plywood, utility plywood, marine plywood, medium density fiberboard (MDF), oriented strand board (OSB), Sundela, hardboard, insulation board, the like, or a combination thereof. Alternately, the connection surface may be a series of structural components which do not form a continuous roof surface, such as in the case of a batten type roof structure. The plurality of solar modules may be connected to the connection surface so that the solar modules are adjacent to one another. For example, an edge of one solar module may be located substantially proximate to an edge of an adjoining solar module. Preferably, the solar modules may partially overlap each other. For example, the active portion of one solar module may overlap a support portion of one or more adjacent solar modules in a similar fashion to how roofing shingles are applied to a roof.

The plurality of solar modules may be configured in any manner so that each of the plurality of solar modules may be electrically connected. Each of the individual solar modules may be electrically connected to an adjacent solar module by one or more interconnect elements. The one or more interconnect elements may be a ribbon, a positive buss bar, a negative buss bar, a connector, a wire, an integrated flashing piece, or a combination thereof. Preferably, the interconnect elements are ribbons that extend between two or more adjacent cells. The interconnect elements may be any connector that extends between two adjacent solar modules and forms an electrical connection. The connectors may assist in securing the two or more adjacent solar modules to a support structure. Preferably, the connectors do not assist in connecting the solar modules to a support structure and the solar modules are connected to the roof structure by a fastener. The interconnect elements, the connectors, or both may be connected to, extend through, be a part of, or a combination thereof the intermediate portion, the active portion, or both. Preferably, the overlap support portion is free of interconnect elements, connectors, or both. The interconnect elements, the connectors, or both may be located within, extend through a portion of, or both the Intermediate portion, the active portion, the frame, or a combination thereof at a location so that one or more fasteners may extend through the intermediate portion, the overlap support portion, or both.

The plurality of solar modules may be connected to the roof by any fastener that has sufficient strength to withstand environmental conditions and form a secure connection. The plurality of solar modules may be connected with a mechanical fastener, an adhesive, an interlocking connection with an adjacent solar module and/or a connection surface, or a combination thereof. The fastener may be a screw, nail, bolt, staple, or a combination thereof. The adhesive may be any adhesive with sufficient strength to connect the solar module to the roof panels. The adhesive may be epoxy based, silicone based, acrylic based, a urethane, a polyamide, a one part adhesive, a multi-part adhesive, a natural adhesive, a synthetic adhesive, or a combination thereof. The connection may be a permanent connection, a removable connection, or both so that a solar module is connected to a connection surface. The solar modules may be lightweight and have a low profile so that the solar modules may be connected directly to the connection surface. The support portion may have one or more fastener supports that extend through the support portion so that the solar module may be connected to one or more connection surfaces.

The fastener supports may be located within the intermediate portion, the overlap support portion, the frame, or a combination thereof. Preferably, the fastener supports may be located within the overlap support portion, in a region where the intermediate portion and the overlap support portion are in contact, or a combination of both. The fastener supports may be a through hole that extends through the support portion, a weakened area so that a fastener may be placed through the support portion, a removable portion, a punch out, an area of lower hardness, or a combination thereof. Preferably, the fastener supports may be a region where the support portion is reinforced so that fasteners may extend through and connect the solar module to the one or more connection surfaces and the fasteners do not damage the solar module when the support portion is subjected to movement. The fastener supports may be a location so that the solar module may be connected to a support portion without damaging the active portion.

The solar module includes an active portion and a support portion. The active portion may be any portion of the solar module that produces electricity when the active portion is in contact with sunlight. The active portion may be made of any material so that when sunlight is directed on the active portion the sunlight in converted into electricity. The active portion may be made of one or more solar cells having a photoactive portion. Preferably, the active portion may be made of a plurality of solar cells. The solar cells may be made of any material that assists in converting sunlight into electricity. The solar cells may be of any type and material known in the art. Some non-limiting examples of materials that the solar cells may be made of include crystalline silicon, amorphous silicon, cadmium telluride (CdTe), gallium arsenide (GaAs), copper chalcogenide type cells (e.g. copper gallium selenides, copper indium gallium selenides, copper indium selenides, copper indium gallium sulfides, copper indium sulfides, copper indium gallium selenides sulfides, gallium arsenide, etc. (i.e., known generally as CIGSS)), amorphous silicon cells, crystalline silicon cells, thin-film III-V cells, thin-film II-VI cells, IB-IIIA-chalcogenide (e.g., IB-IIIA-selenides, IB-IIIA-sulfides, or IB-IIIA-selenide sulfides), organic photovoltaics, nanoparticle photovoltaics, dye sensitized solar cells, and/or combinations of the described materials. In one specific example, the copper indium gallium selenides may be represented by the formula $CuIn(1-x)Ga_xSe(2-y)S_y$ where x is 0 to 1 and y is 0 to 2. For copper chalcogenide type cells, additional electroactive layers such as one or more of emitter (buffer) layers, conductive layers (e.g. transparent conductive layers) or the like may be used in CIGSS based solar cells are contemplated by the teachings herein. The active portion may be flexible or rigid and come in a variety of shapes and sizes, but generally are fragile and subject to environmental degradation. In a preferred embodiment, the active portion is a cell that can bend without substantial cracking and/or without significant loss of functionality. Other materials and/or combinations are contemplated herein especially those compositions disclosed in paragraph 0054 of U.S. Patent Application Publication No. 2012/0118349, which is incorporated herein by reference as to materials for the active portion. The solar cells of the active portion may be arranged in parallel, series, mixed series-parallel, and/or may be provided in independent circuits. The active portion may be an assembly.

The assembly may include one or more of the following components: a forward protective layer, a rearward protective layer, a reinforcement, a solar cell, one or more internal protecting layer, or a combination thereof. One or more of the layers discussed herein may be a combination of layers. For example, a forward protective layer may be a combination of multiple glass layers combined together. As another example, the reinforcement may be a plurality of layers bonded together. As discussed herein, each individual layer may include an adhesive so that one or more layers are bonded together forming a layer, each layer may include an adhesive over and/or under another layer so that the one or more adjacent layers are bonded together. Other components and layers of the solar module are contemplated herein that may be used with the reinforcement taught herein especially those components, layers, and/or materials disclosed in Paragraph Nos. 0048-0053 of U.S. Patent Application Publication No. 2012/0118349, and Paragraph Nos. 0027-0038 and FIGS. 2A and 2B of U.S. Patent Application Publication No. 2011/0220183, both of which are expressly incorporated herein by reference as to components, layers, and/or materials for active portions that may be used in conjunction with the reinforcement and solar module discussed herein. One or more of the layers of the solar cell may be electrical circuitry.

The electrical circuitry of the active portion may be one or more buss bars, one or more ribbons, or both. The electrical circuitry may extend from cell to cell, solar module to solar module, cell to a solar module, active portion to active portion, or a combination thereof. The electrical circuitry may be integrated into the one or more solar cells, connect the one or more solar cells, be electrically connected to the one or more solar cells, or a combination thereof. The electrical circuitry may be integrated into and/or around one or more layers of the active portion. The electrical circuitry may extend through the active portion, a portion of the support portion, an intermediate portion formed by an overlap between the active portion and the support portion, or a combination thereof.

The support portion and the active portion may be located adjacent to one another. The support portion may include an upper surface, a lower surface, one or more reinforcing ribs, an overlap support portion, a frame support portion, an intermediate portion, or a combination thereof. The frame support portion may be any portion that forms a border around all or a portion of the active portion and provides support to the active portion. The frame support portion may form a frame around all or a portion of the active portion, may extend around one or more edges of the active portion, may extend from an edge of the active portion, may extend from an intermediate portion, may form a back of the active portion, may overlap all or a portion of the active portion, or a combination thereof. Preferably, the support portion does not extend behind the active portion. For example, the support portion may extend around edges of the active portion and contact edges of the active portion so that the two parts are connected, but the support portion does not extend along a rear side (i.e., a side that is opposite the side exposed to the sun) of the active portion. The support portion may form a layer of protection for the active portion, one or more adjacent active portions, or a combination of both.

The support portion may include a flat planar surface. The flat planar surface may be an upper surface, a lower surface, or both. Preferably, if the support portion includes an upper surface the support portion is free of a lower flat surface, or vice versa. More preferably, the flat planar surface may form the overlap support portion. The overlap support portion may include an upper surface, a lower surface, one or more reinforcing ribs, or a combination thereof. The overlap support portion may be any portion that extends over the support structure and is covered by one or more active portions of one or more solar modules so that the overlap support portion provides support to the active portions of an adjacent solar module when the active portions overlap the overlap support portion. The support portion, and preferably the overlap support portion may taper as the support portion extends away from the active portion, the intermediate portion, or both. For example, the thickness of the support portion adjacent to the active portion may be about 15 mm and the thickness of the support portion at an edge furthest from the active portion may be about 3 mm and the points therebetween may gradually reduce in size as the support portion extends away from the active portion, the Intermediate portion, or both.

The support portion may have any thickness so that the solar module may be directly connected to a connection surface. The support portion may have any thickness so that one or more adjacent active portions may overlap all or a portion of the support portion. The thickness of the support portion may vary across the length and/or width of the support portion. For example, the thickness of the support portion may be the height of the reinforcing ribs plus the upper surface, the lower surface, or both. The support portion may have a thickest region $T_O$. The thickness in the thickest region of the support portion may be about 3 mm or more, preferably about 5 mm or more, or more preferably about 8 mm or more. The thickness in the thickest region of the support portion may be about 50 mm or less, about 30 mm or less, preferably about 25 mm or less, more preferably about 20 mm or less, or most preferably about 15 mm or less. The support portion may taper to a thinnest region $T_S$. The thickness of the thinnest region of the support portion may be about 0.2 mm or more, about 0.5 mm or more, or about 1 mm or more. The thickness of the thinnest region of the support portion may be about 15 mm or less, about 10 mm or less, about 5 mm or less, or about 2 mm or less. The thickest region $T_O$ and the thinnest region $T_S$ may have a ratio. The ratio of $T_O$ to $T_S$ may be about 1:1 or more, about 2:1 or more, preferably about 3:1 or more, more preferably about 5:1 or more, or most preferably about 7:1 or more. The ratio of $T_O$ to $T_S$ may be about 40:1 or less, about 30:1 or less, or about 25:1 or less. The thickest region of the support portion may be in the intermediate portion, the overlap support portion, or both. The thickness of the solar module when measured at the Intermediate portion may include a portion of the active portion and the support portion. The thickness may vary along the length, the width, or both.

The length (i.e., longitudinal direction or direction of roof slope) of the support portion may be any length that is sufficient so that the length of the support portion is substantially the same length as the active portion or more, the support portion forms a structural base for all and/or a portion of the active portion, or both. The total length of the support portion may be about twice as long as the length of the active portion. For example, the support portion may have a frame that extends the length of the active portion and the support portion may include a portion that extends from an intermediate portion that is substantially the same size as the active portion (i.e., the overlap support portion). The length of the support portion extending from the active portion (i.e., the intermediate portion, the overlap support portion, or both) may be sufficiently large so that an adjacent active portion may cover the support portion and be supported by the support portion. The length of the overlap support portion, the intermediate portion, or both (i.e., which does not include the frame around the active portion) may be any length so that the active portion is sufficiently supported by the support portion and is substantially free of damage when a mass is applied to the active portion. The overlap support portion, the intermediate portion, or both may be substantially the same size as the active portion (i.e., within ±2 cm or less). Preferably, the length of the overlap support portion, the intermediate portion, or both may be about 110 percent or more, about 115 percent or more, about 120 percent or more, or about 125 percent or more the size of the active portion. The length of overlap support portion, the intermediate portion, or both may be about 200 percent or less, about 175 percent or less, or about 150 percent or less the size of the active portion. The overlap support portion, the intermediate portion, or both may have a length of about 12 cm or more, about 25 cm or more, preferably about 30 cm or more, more preferably about 35 cm or more, or even about 45 cm or more. The support portion includes a width.

The width of the support portion may be any width so that when overlapped by one or more solar modules the support portion provides support to the active portion. The support portion may have more than one width. For example, the frame may have a width and the overlap support portion may have a width that is substantially the same as the width of the frame plus the active portion. Preferably, the width of the overlap support portion and the intermediate portion are substantially the same. The width of the overlap support portion, the intermediate portion, or both may be about 60 cm or more, preferably about 75 cm or more, more preferably about 90 cm or more, even more preferably about 100 or more, or most preferably about 105 cm or more. The width of the frame portion may be sufficiently wide so that the frame portion provides protection to the active portion. The frame portion may be about 5 mm wide or more, about 7 mm wide or more, or preferably about 1 cm wide or more. The width of the overlap support portion to the length of the overlap support portion may have a ratio of width to length. The ratio of width to length may be about 1.5:1 or more, about 2:1 or more, preferably about 2.5:1 or more, and even more preferably about 3:1 or more. The length of the overlap support portion may include the Intermediate portion. Preferably, the length of the intermediate portion is not included in the length of the overlap support portion.

The Intermediate portion may be any part of the solar module where the active portion and the support portion are connected. The intermediate portion may overlap functional elements that extend through the active portion of a solar module. The intermediate portion may overlap and seal part of the active portion. The intermediate portion may contain all or a portion of one or more buss bars, one or more ribbons, one or more connection ports, one or more integrated flashing pieces, or a combination thereof for forming an electrical connection, allowing power to flow through the solar module, or both. The Intermediate portion may be a portion of the solar module that includes one or more gate locations and preferably a plurality of primary gate locations.

The one or more gate locations may be any part of the solar module where material may be added so that all or a portion of the solar module, the support portion, the intermediate portion, a frame support portion, an edge portion around the active portion, or a combination thereof may be formed. The one or more gate locations may be located at any location in the solar module, along the solar module, or both. The one or more gate locations may be at a front of the support portion (i.e., a side facing up towards the sun), on the rear of the support portion (i.e., facing a connection surface), on an edge of the support portion, (i.e., along a thickness of the support portion), or a combination thereof. Preferably, the one or more gate locations may substantially span a length (i.e., the longitudinal direction) and/or width (i.e., transverse direction) of the support portion. The one or more gate locations may span diagonally across the support portion or have a staggered relationship. The one or more gate locations may be spaced apart and span between two edges of the support portion. One or more of the gate locations may be sporadically placed. For example, each frame may include one or more gate locations that are located randomly relative to the other gate locations. The one or more gate locations may be uniformly placed along the support portion. For example, the gate locations may be placed in a line or matched pairs.

The one or more gate locations may be open during the entire formation of the support portion. The one or more gate locations may be opened in a sequence during the formation of the support portion. For example, a gate in the center may be opened first and then as the center gate location begins to fill the gate locations moving outward from both sides may be opened and filled. The sequence of opening the gate locations may be any sequence so that as the polymeric composition flows within the support portion in a linear manner along the length, along the width, or both. The gate locations may be sequenced so that the primary gate locations open first, the secondary gate locations open second, and the tertiary gate locations open third. Preferably, the sequence of opening the gate locations is such that radial flow is substantially eliminated (i.e., about 10 percent or less, about 5 percent or less, or about 2 percent or less, of the flow is in a direction other than along the length or the width) or preferably completely eliminated.

The support portion, the intermediate portion, or both may include only a series of primary gate locations. The primary gate locations may be located at any location along the support portion. Preferably, the primary gate locations are in the Intermediate portion. The support portion may include a plurality of primary gate locations, a plurality of secondary gate locations, or both. The support portion may include one or more secondary gate locations. The one or more secondary gate locations may be located at any location along the support portion that is spaced apart from the primary gate locations. Preferably, the secondary gate locations extend through a central region, a middle portion, or both of the overlap support portion. The secondary gate locations may be located substantially half way between the primary gate locations and a distal edge (i.e., an edge of the support portion furthest from the active portion). The support portion may include tertiary gate locations that are located distal from the primary gate locations and the secondary gate locations. Preferably, when tertiary gate locations are present they are located on the frame support portion around the active portion. The gate locations may be formed in the solar module when a polymeric composition extends into a mold to form the support portion. The gate locations may be a point where a polymeric composition is injected so that the support portion, one or more ribs, an upper surface, a lower surface, or a combination thereof are formed.

The active portion, the support portion, the intermediate portion, or a combination thereof may each have an upper surface, a lower surface, or both. Preferably, the active portion includes an assembly and includes both an upper surface and a lower surface. Preferably, the support portion, the intermediate portion, or both include only an upper surface or a lower surface and include one or more ribs extending from the respective upper surface, lower surface, or both. The overlap support portion may include only an upper surface or only a lower surface and the intermediate portion may include the same upper surface or same lower surface. For example, the upper surface of the intermediate portion extends and forms the upper surface of the support portion. However, the intermediate portion may include an opposite surface as the overlap support portion. For example, if the overlap support surface includes an upper surface then the intermediate portion includes a lower surface or vice versa. In another example, the overlap support portion may include an upper surface and the same surface may form the lower surface of the intermediate portion. All or a portion of the frame support portion may include both an upper surface and a lower surface and the overlap support portion may include the upper surface, the lower surface, or both. The upper surface, the lower surface, or both may include a thickness.

The thickness of the upper surface, the lower surface, or both may vary at different regions of the support portion. The upper surface, the lower surface, or both may have the largest thickness in the intermediate portion, the frame support portion, or both. The thickness of the upper surface, the lower surface, or both in the frame, the intermediate portion, or both may be sufficiently large so that flow of polymeric composition during the formation of these sections is linear (i.e., expands in substantially straight lines as opposed to radially). As discussed herein, the process may include a step of controlling the amount of polymeric composition flow along the rib, adjusting the orientation of the rib, adjusting the composition of the polymeric composition used for the support portion, or a combination thereof so that a resultant support portion may have dimensional stability, flatness, or both. By having the wall thickness of the rib below that of the upper surface, the lower surface, or both, the polymer flow can be non-aligned to the rib orientation. By having the rib wall thickness greater than the upper surface, and/or the lower surface, the polymeric composition may flow along a length of a rib resulting in different mechanical properties. The thickness of the upper surface, the lower, surface, or both in the frame support portion, the intermediate portion, or both may be larger than the thickness in the overlap support portion so that as polymeric composition extends from the gate locations in the intermediate portion the polymeric composition linearly flows into the overlap support portion. The thickest part of the upper surface, the lower surface, or both of the overlap support portion may have a thickness (X) and the intermediate portion may have a thickness that is about 1.1X or more, about 1.3X or more, about 1.5X or more, about 2X or more, or even about 3X or more.

The upper surface, lower surface, or both may be any surface that may be substantially flat, extend substantially parallel to a connection surface, or both. The support portion may include both an upper surface and lower surface with one or more ribs extending there between. Preferably, the support portion includes only an upper surface or only a lower surface with one or more ribs being connected to the respective surface. Preferably, the upper surface, the lower surface, or both may be substantially planar and/or planar so that that one or more adjacent active portions may extend over the support portion and the support portion provides a support surface for the active portion. The upper surface, the lower surface, or both may include one or more holes so that a fluid may pass through, the respective surface. Preferably, the upper surface, the lower surface, or both may be generally contiguous (i.e., free of holes or gaps) so that the upper surface, the lower surface, or both form a fluid barrier over the connection surface. The upper surface, the lower surface, or both may be free of bends, warp, curves, non-planar portions, or a combination thereof. The upper surface, the lower surface, or both may constructed of a polymeric composition, a fiber reinforced polymeric composition, or both.

The polymeric composition, the fiber reinforced polymeric composition, or both may be oriented within the upper surface, the lower surface, or both. The polymeric composition, the fiber reinforced polymeric composition, or both within the upper surface, the lower surface, or both may be substantially aligned along a length or a width of the support portion (i.e., ±10 degrees or less, or preferably ±5 degrees or less). The polymeric composition, the fiber reinforced polymeric composition, or both within the upper surface, the lower surface, or both may be aligned along a primary flow direction, a secondary flow direction, or both. The polymeric composition, the fiber reinforced polymeric composition, or both within the upper surface, the lower surface, or both preferably may not be radially oriented. For example, the polymeric composition, the fiber reinforced polymeric composition, or both may be free of arcuate portions within the upper surface, the lower surface, or both. The polymeric composition, the fiber reinforced polymeric composition, or both within the upper surface, the lower surface, or both may be substantially perpendicular to one or more reinforcing ribs, in a plane above or below the one or more reinforcing ribs, or both.

One or more reinforcement ribs may extend from and be connected to the upper surface, the lower surface, or both. For example, the upper surface, the lower surface, or both and the reinforcing ribs may be one integrally formed piece. The one or more reinforcement ribs may be any rib that extends away from the upper surface, the lower surface, or both and provides support to the upper surface, the lower surface, or both. The reinforcing ribs may be individual ribs that are free of contact with any adjacent ribs. Preferably, the reinforcing ribs are a series of interconnected ribs that extend at angles relative to each other forming a network structure. More preferably, the support portion includes a plurality of reinforcing ribs and at least some of the reinforcing ribs are interconnected. The reinforcing ribs may form discrete closed structures, interconnected closed structures, or both. The reinforcing ribs may be located on an upper surface, a lower surface, or both so that when a force is applied to the support portion the reinforcing ribs are placed in tension, in compression, or a combination of both and provide transverse stiffness, longitudinal stiffness, or both and substantially resist flexing, bending, or both of the attached active portion, an adjacent active portion, or both. The reinforcing ribs may be located at an angle relative to each other so that when a force is applied to the support portion the ribs resist being moved towards each other, resist being moved away from each other, or both.

The reinforcing ribs may extend at virtually any angle relative to the length and width of the support portion. Preferably, the reinforcing ribs extend at an angle relative to the length and width (i.e., are not perpendicular and/or parallel to the length and/or width). For example, the one or more ribs may form a 45 degree angle with an edge that extends along the length and an edge that extends along the width. The reinforcing ribs may extend at any angle that disrupts the flow path of the polymeric composition. The angle of the reinforcing ribs may extend at an angle so that the polymeric composition is disrupted in a primary direction, a secondary direction, or both. One or more reinforcing ribs may be connected together and may form a geometric shape. The one or more reinforcing ribs may be connected together forming a closed pattern (i.e., a reinforcement structure). The one or more reinforcing ribs may be connected together forming a closed pattern and the closed pattern may be connected to an adjacent closed pattern so that a series of interconnected ribs is formed (i.e., a reinforcement structure). Each of the ribs, each closed pattern, or both may be located close together (e.g., separated by a distance of about 2 mm or less, about 1 mm or less, or about 0.5 mm or less). One or more reinforcing ribs may be geometric, non-geometric, symmetrical, non-symmetrical, a circle, triangle, a polygon, a diamond, pentagon, hexagon, heptagon, octagon, nonagon, decagon, a hectogon, or a combination thereof. The reinforcing ribs when formed into a network structure may have a portion that is perpendicular and/or parallel to the length and/or width; however, a majority (i.e., 51 percent or more, 70 percent or more, or even 80 percent or more by length) of the reinforcing ribs extends at a non-perpendicular and/or non-parallel angle relative to the width and/or length of the support portion.

The effective modulus of the support structure can be calculated based on the material properties and geometry for the structure. The effective modulus is defined as stiffness in a given direction of the structure as a function of both material properties and geometry effects included. The effective modulus is generally for a given cross-sectional projected area, including both solid areas and open areas between ribs and walls. In the case of the support portion, the materials may be of a variety of types including composite constructions such as a combination of polymeric with fillers and additives. Both the polymeric with fillers and additives may have anisotropic properties due to the alignment of the polymer or of inorganic fillers. This alignment may be by design of materials or a function of stress and strain during manufacturing. By calculating the effective modulus, the geometry of the ribs in the support structure may be used to adjust the stiffness of the support portion in a given direction, either augment, to counteract a non-Isotropic material property, or a combination thereof.

It is contemplated that the effective modulus can be adjusted for multiple directional forces or combinations of modes. These modes include but are not limited to tensile, compression, bending, shear, thermal loads, or a combination thereof. The location of the top or bottom surfaces combined with the rib orientation, thickness, length, frequency, quantity, or a combination thereof can be adjusted to provide necessary effective modulus in a direction. Specific consideration may be given with respect to thermal related stresses and strains present from processing or service. The coefficient of linear thermal expansion may vary between materials, components, or subcomponents in the installed system resulting in stresses and strains which can be designed for by adjusting the effective modulus The angle of the ribs may be varied based upon the desired directional stiffness of the support region (e.g., a predetermined effective modulus in a given direction). The angle of the ribs may be varied so that the effective modulus of the width is different than the effective modulus of the length of the support portion. Preferably, the angles of the one or more reinforcing ribs are varied until the stiffness in the width direction is substantially equal to the stiffness in the length direction. For a reinforcement structure having six sides the effective modulus along the secondary flow direction of the polymeric composition during manufacture (i.e., length) of the support portion may be calculated using the following formula:

$$E_1 = E_s \left(\frac{t}{l}\right)^3 \frac{(1 + \sin\theta)}{\cos^3\theta}$$

Where:
t=thickness of the reinforcing ribs
l=length of the reinforcing ribs where all ribs are of equal length
θ=angle from direction of flow to wall reinforcing rib
$E_1$=Effective modulus along the length of the solar module (e.g., X2) and
$E_s$=Elastic modulus of the bulk material
Similarly, the effective modulus along the primary flow direction of the polymeric composition during manufacture (i.e., width) of the support portion may be calculated using the following formula for a geometry having six sides:

$$E_2 = E_s \left(\frac{t}{l}\right)^3 \frac{\cos\theta}{(1 + \sin\theta)\sin^2\theta}$$

Where:
t=thickness of the reinforcing ribs
l=length of the reinforcing ribs where all ribs are of equal length
θ=angle from direction of flow to wall reinforcing rib
$E_2$=Effective modulus along the width of the solar module (e.g., X1) and
$E_s$=Elastic modulus of the bulk material
The following equation may be used to determine the change in effective moduli as a function of θ by combining the two equations above, which results in the following equation:

$$\frac{E_2}{E_1} = \frac{\cos^4\theta}{(1 + \sin\theta)^2 \sin^2\theta}$$

Thus, depending on the length of the reinforcing ribs, the thickness of the reinforcing ribs, the material characteristics, the angle of the reinforcing ribs, or a combination thereof the effective modulus may be substantially equal across the length and width (i.e., with a ratio equal to 1±50 percent or less). A ratio of $E_1$ to $E_2$ can be calculated by providing a constant for some of the variables such as theta, thickness, and length and adjusting the material properties of the material. For example, Theta may be 30 degrees, the thickness may be 1 mm, the length may be 30 mm, a polymeric fiber reinforced resin may be used. If the resulting ratio of Es in the 1-direction and $E_s$ in the 2-direction are not equal then theta may be adjusted until $E_1$ and $E_2$ are substantially equal. It may be desirable in some circumstances for the ratio of $E_1$ to $E_2$ to not be 1. The ratio of $E_1$ to $E_2$ may be about 5:1 or less, about 4:1 or less, preferably about 2:1 or less, and more preferably about 1.5:1 or less, the ratio of $E_1$ to $E_2$ may be about 1:5 or less, about 1:4 or less, preferably about 1:2 or less, or more preferably about 1:1.5 or less. Thus, depending on a desired effective modulus θ may be about 15 degrees or more, preferably about 20 degrees or more, or more preferably about 25 degrees or more. Depending on a desired effective modulus θ may be about 60 degrees or less, about 45 degrees or less, or about 35 degrees or less.

The one or more reinforcing ribs may have a sufficient height so that the reinforcing ribs extend from an upper surface into contact with a support structure (e.g., a roof) or a lower surface and into contact with a bottom wall of an active portion of one or more adjacent solar modules so that a tapered surface is formed. The height of the one or more reinforcing ribs may be tapered as discussed above with regard to the height support portion. The height of the one or more reinforcing ribs may be one of the heights of the support portions as discussed above. Thus, the height of the reinforcing ribs may vary along with length and/or width of the support portion so that the support portion may form a flat surface for the active portion, may be parallel to the support structure, or both. Each reinforcing rib may have a thickness.

The thickness of the reinforcing ribs may be a distance between two adjacent faces of the reinforcing ribs. Stated another way, each reinforcing rib includes two substantially parallel walls that extend along the height between the upper surface and the support structure and/or the lower surface and the bottom of one or more adjacent active portions and the distance between the two substantially parallel walls is the thickness of each reinforcing rib. The thickness may be any thickness so that the reinforcing ribs provide sufficient rigidity, flexibility, effective modulus, or a combination thereof to the support portion so that the support portion remains flat, planar, or both so that the reinforcing ribs may be compliant to the attachment structure if so desired. For example, when a force is applied to the support portion the one or more reinforcing ribs are placed in tension so that the upper surface resists deflection and remains substantially planar so that support is provided to the active portion. The thickness may be any thickness so that the support portion supports the weight of the active portion, an installer, or both without substantial deflection by the support portion so that the active portion is free of damage. The thickness may be sufficient so that when reinforcing fibers are used in the polymeric composition, the reinforcing fibers may extend into the reinforcing ribs, be aligned along the length of the reinforcing ribs, extend along the height of the reinforcing ribs (i.e., be normal to the upper surface, lower surface, or both), or a combination thereof. Preferably, the thickness of each reinforcing rib is greater than a thickness of a largest reinforcing fiber used in the polymeric composition so that during manufacture the reinforcing fibers extend at least partially into the reinforcing ribs. The thickness of the reinforcing ribs is sufficiently thick so that the polymeric composition, the reinforcing fibers, or both extend into, flow along a length of, or both the reinforcing ribs during manufacture. The thickness of the reinforcing ribs may be about 0.2 mm or more, about 0.5 mm or more, or about 1 mm or more. The thickness of the reinforcing ribs may be about 5 mm or less, about 3 mm or less, or about 2 mm or less. The thickness of the reinforcing rib may be varied based upon the type of polymeric composition used to create the support portion, the angle of each rib as discussed above, the length of the ribs, the thickness of the upper surface, the thickness of lower surface, or a combination thereof. Each of the reinforcing ribs may include one or more depressions.

Each of the one or more depressions may be any part of the reinforcing rib where the height of the rib is less than a height of a surrounding rib, a space is formed for fluids to flow, or both. The one or more depressions may be any device that may allow a fluid to flow from the support portion, the active portion, or both of a solar module. Each reinforcing rib may include one or more depressions, a predetermined region of reinforcing ribs that may include a depression and the other reinforcing ribs may be configured to channel a fluid to the one or more depressions, or both. The depression may be a hole that extends through a rib, a vertical slit in the rib, an absence of a portion of a rib, a gap between two adjacent ribs, or a combination thereof. Preferably the depression is a taper in a rib so that fluid may pass over and/or under the depression and is not retained by the reinforcing rib. The location of the depression may be determined by a predetermined orientation of the reinforcing ribs. For example, if the ribs are designed to be oriented so that the reinforcing ribs face a support structure then the depression may be positioned so that a fluid runs under the depression along the support structure. In another example, if the ribs are intended to be oriented so that the reinforcing ribs face up (i.e., there is only a lower surface) then the depression may be located proximate to the lower surface so that a fluid passes through the depression along the lower surface, under a portion of the reinforcement rib through the depression, or both. Each of the depressions may lead to a gap between two or more adjacent reinforcement ribs (i.e., the upper surface, the lower surface, or both).

The polymeric composition may be any polymeric composition that may have low shrinkage, result in an even elastic modulus between a length and width, or a combination of both. The polymeric composition may be any polymeric composition that may be flowable, have high insulating properties, fluid impermeable, high flexibility, low creep, low modulus, or a combination thereof. Some polymeric compositions that may be used with the solar module taught herein are an elastomer, thermopolastic, thermosetting polymer, or a combination thereof. The polymeric composition may include a filled or unfilled moldable plastic, polyolefins, acrylonitrile butadiene styrene (ABS), hydrogenated styrene butadiene rubbers, polyester amides, polysulfone, acetel, acrylic, polyvinyl chloride, nylon, polyethylene terephthalate, polycarbonate, thermoplastic and thermoset polyurethanes, polyethylene, polystyrene synthetic and natural rubbers, epoxies, styrene-acrylonitrile (SAN), Acrylic, polystyrene, thermoplastic urethane polymer, thermoplastic elastomer (TPO, TPE, TPR), polyamides, silicones, vinyl based resins, or any combination thereof. The polymeric composition may be free of fillers, fibers, reinforcing materials, or a combination thereof. The polymeric composition may include fillers such as colorants, fire retardant (FR) or ignition resistant (IR) materials, reinforcing materials, such as glass or mineral fibers, surface modifiers, or a combination thereof. The polymeric composition may also include anti-oxidants, release agents, blowing agents, and other common plastic additives.

The support portion may be created by any process where the resulting support portion is substantially flat and free of warp, free of curl, or both. The support portion may be created by compression molding, injection molding, lamination, or a combination thereof. Preferably, the support portion is produced by injection molding. During processing of the support portion the material properties of the resultant support portion may be substantially different as a result of the flow directions of the polymeric composition (i.e., longitudinal and normal (transverse) directions). The polymeric composition, fibers, fillers, reinforcing material, or a combination thereof may be oriented by the shear stresses of processing such that the polymeric composition is not isotropic in the regions outside of the reinforcing ribs after processing, but are substantially isotropic within the reinforcing ribs after processing. When the polymeric composition includes anisotropic materials (e.g., glass, mica, etc.) filled polymers, or both to form the support portion, the support portion may have higher strength, higher elongation, a lower Coefficient of Thermal Expansion in the longitudinal direction than the transverse direction, or a combination thereof. These materials may result in a different elastic modulus between the length and width versus a material without the anisotropic materials, and therefore the angle of reinforcement ribs may be varied so that the elastic moduli of the length and width are substantially equal. The opposite material properties may be present if the material is not filled with an anisotropic mineral filler. The change in material characteristic may result in distortion of the molded part after removal from the mold used for manufacturing so that the angle of the reinforcing ribs may be calculated for each support portion as discussed herein.

FIG. 1 illustrates a front view of a solar module 2. The solar module 2 includes an active portion 4 and a support portion 6. The active portion 4 includes a plurality of solar cells 52 disposed therein. The support portion 6 includes an overlap support portion 6A, a frame support portion 6B that extends around the active portion 4, and an intermediate portion 6C. A series of fastener locations 50 are located in the overlap support portion 6A and proximate to the Intermediate portion 6C.

Figure 2:
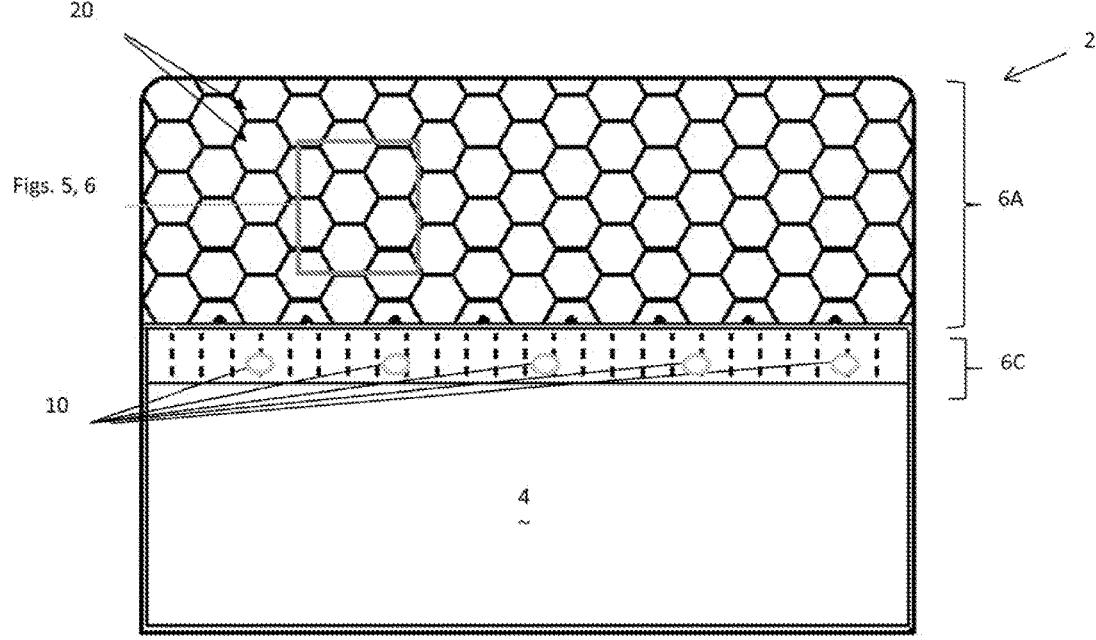
FIG. 2 illustrates a bottom view of one embodiment of the present teachings.

FIG. 2 illustrates a bottom side of a solar module 2. The solar module 2 includes an active portion 4, a support portion 6A, and an intermediate portion 6C. A series of gate locations 10 are located in the intermediate portion 6C between the active portion 4 and the support portion 6. The gate locations 10 are a location where a polymeric composition and/or fiber reinforced polymeric composition is injected into a mold (not shown) so that the support portion 6 and reinforcement ribs 20 are formed. The intermediate portion 6C includes a greater nominal wall thickness than the support portion 6, and the thickness of the support portion 6 tapers as the support portion 6 extends away from the intermediate portion 6C. During the manufacture process, the intermediate portion 6C will be substantially filled prior to a polymeric composition advancing to form the support portion 6. As the polymeric composition extends out of the intermediate portion 6C into the support portion 6 the flow will be substantially linear from the active portion 4 to the overlap support portion 6A unless the flow is changed by the reinforcement ribs 20.

Figure 3:
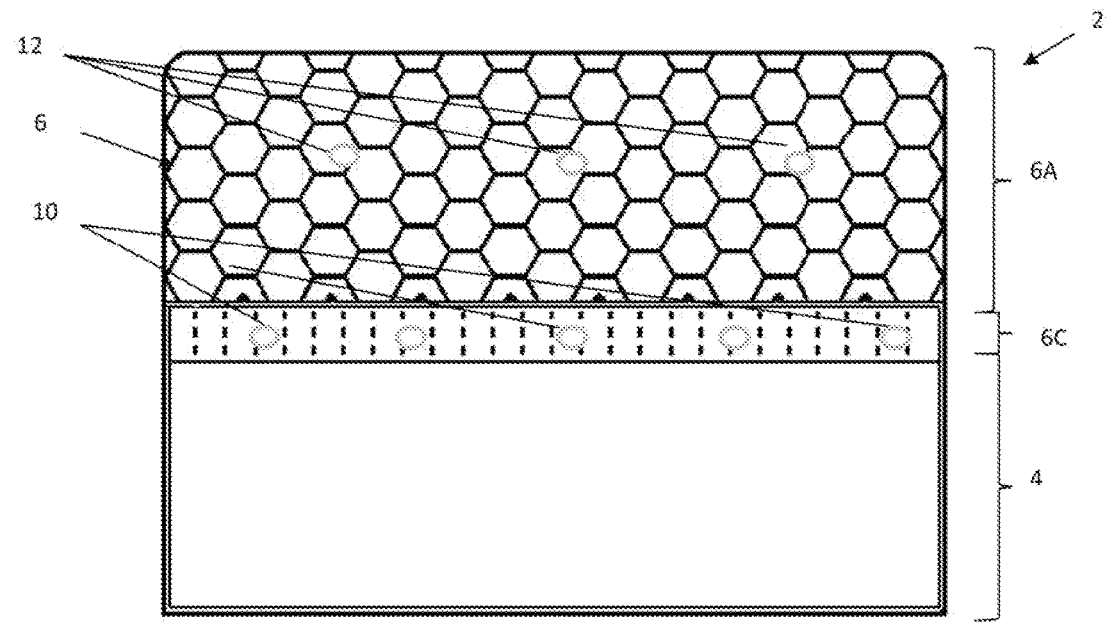
FIG. 3 illustrates a bottom view of another embodiment of the present teachings includes two series of gate locations.

FIG. 3 illustrates a bottom side of a solar module 2 having an active portion 4, an support portion 6, and an intermediate portion 6C including a series of primary gate locations 10. The solar module 2 as illustrated includes a row of primary gate locations 10 and a row of secondary gate locations 12 each row having a plurality of gate locations. The set of primary gate locations 10 is located in the intermediate portion 6C between the overlap support portion 6A and the active portion 4. The secondary gate locations 12 are located across a central region of the overlap support portion 6A.

Figure 4:
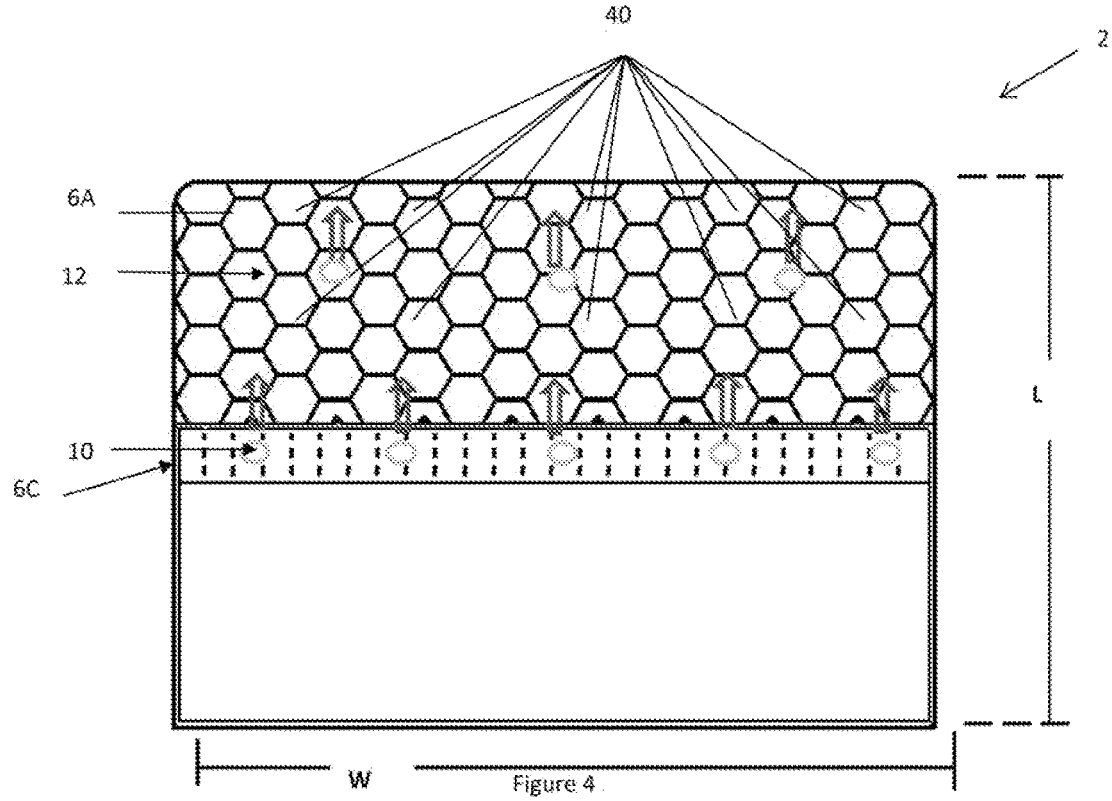
FIG. 4 illustrates a bottom view of FIG. 3 illustrating the primary flow direction.

FIG. 4 illustrates a solar module 2 including a row of primary gate locations 10 and secondary gate locations 12. As illustrated, the material that forms the overlap support portion 6A flows from the primary gate locations 10 in the intermediate portion 6C and the secondary gate locations 12 in a primary flow direction 40. The solar module 2 has a length (L) and a width (W).

Figure 5:
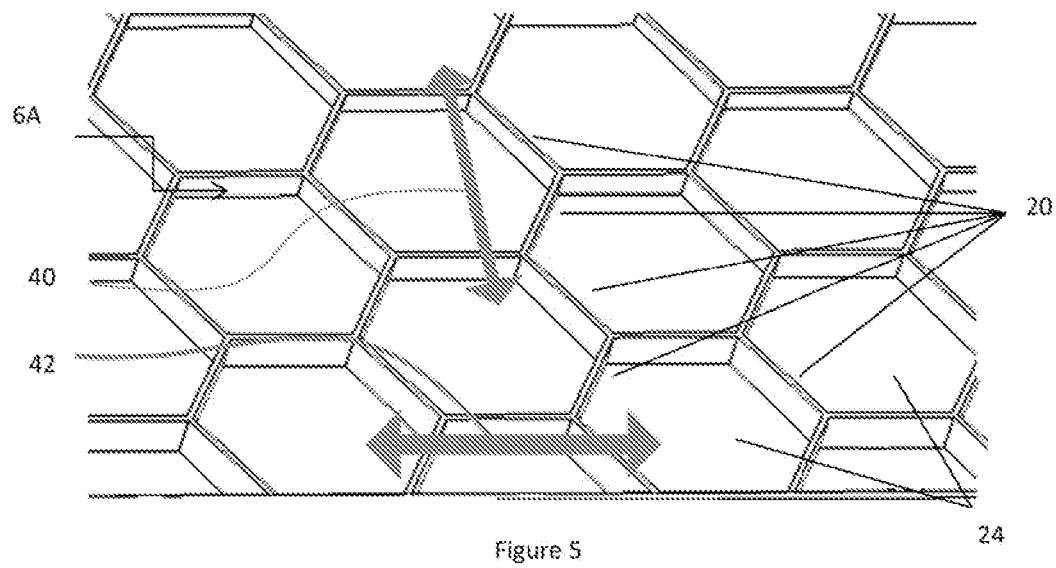
FIG. 5 is a close-up view of one possible configuration of the reinforcement ribs of FIG. 2.

FIG. 5 is a close-up view of one example of the overlap support portion 6A of FIG. 2. The overlap support portion 6A includes a plurality of reinforcement ribs 20 and gaps 24 between the reinforcement ribs 20. The gaps 24 are a space between the reinforcement ribs 20 where the upper surface or the lower surface is exposed. The reinforcement ribs 20 are formed as the polymeric composition flows through the gaps 24 (i.e., upper surface or lower surface) of the overlap support portion 6A and in the primary flow direction 40. As some ribs are transverse to this primary flow direction 40, and aligned with the secondary flow direction 42, the transverse ribs will fill as the material advances past them.

Figure 6:
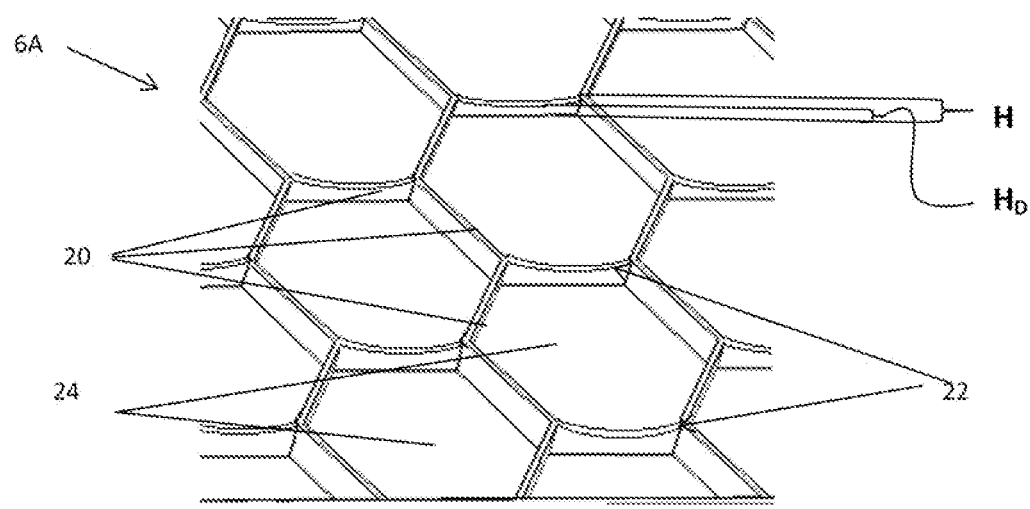
FIG. 6 is a close-up view of another possible configuration of the reinforcement ribs of FIG. 2.

FIG. 6 is a close-up view of another possible example of the overlap support portion 6A of FIG. 2. The overlap support portion 6A includes a plurality of interconnected reinforcement ribs 20 with gaps 24 therebetween exposing the upper surface or the lower surface. Each of the reinforcement ribs 20 have a height (H). Some of the plurality of reinforcement ribs 20 include a rib depression 22 having a height ($H_D$). As illustrated, the rib depression 22 has a height ($H_D$) that is less than the height (H) of the reinforcement rib.

Figure 7:
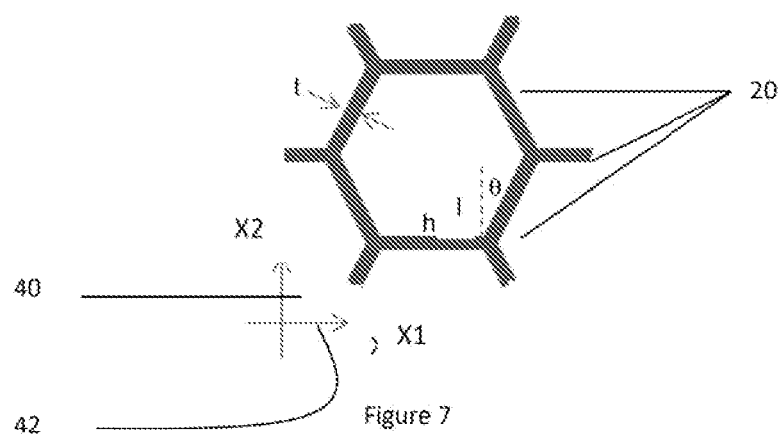
FIG. 7 is a top view of one possible configuration of the reinforcement ribs of the teachings herein.

FIG. 7 illustrates a plan view of one possible configuration of the reinforcement ribs 20. The reinforcement ribs 20 as illustrated, have a thickness (t). During manufacture of the reinforcement ribs 20 the material extends normal to the primary flow direction 40 with minimal flow along the secondary flow direction 42 so that each of the reinforcement ribs 20 are formed. As the material forms the rib the material is directed longitudinally along the length (l) so that radial expansion in the secondary flow direction 42 is prevented. The material is then channeled along the next portion of the reinforcement rib 20, which forms an angle (9) with the primary flow direction 40. Alternatively, the material flows along the primary flow direction 40 and the polymeric composition will extend vertically into the reinforcement ribs 20 (i.e., substantially normal to the upper surface, the lower surface, or both).

Figure 8:
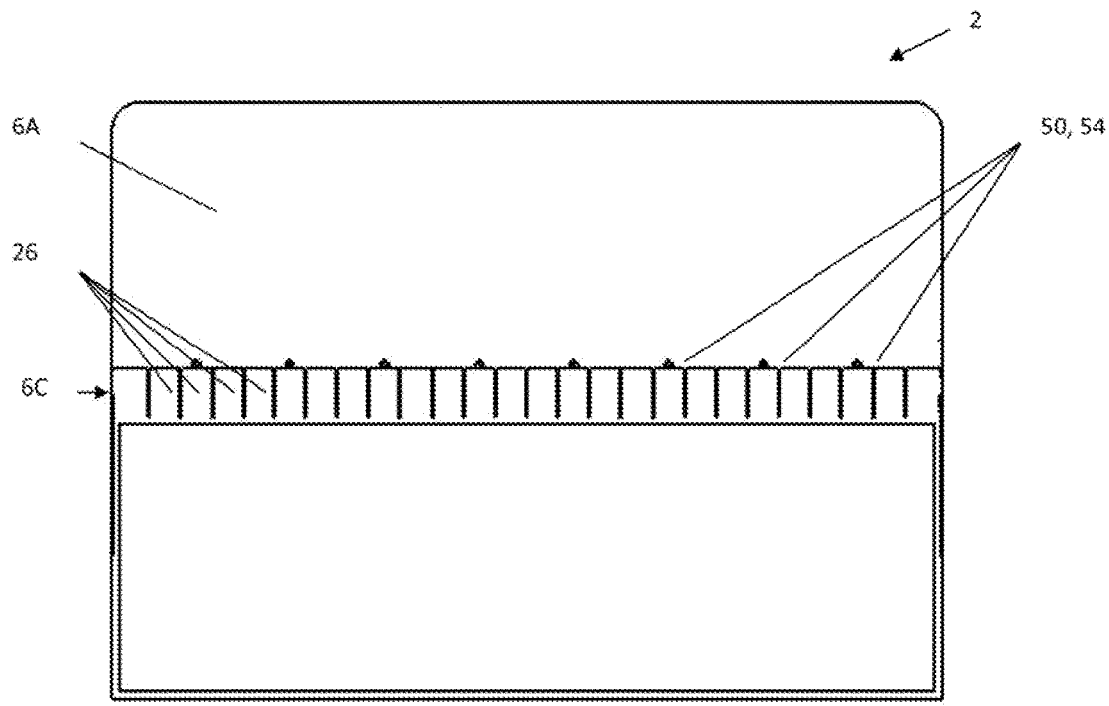
FIG. 8 illustrates a support portion of a solar module of the teachings herein having fastener supports proximate to an intermediate portion.

FIG. 8 illustrates a top view of one solar module 2 where the fastener locations 50 are in the overlap support portion 6A on the edge of the intermediate portion 6C and include fastener supports 54. The intermediate portion 6C includes a plurality of intermediate reinforcement ribs 26 that extend throughout the intermediate portion 6C.

Figure 9:
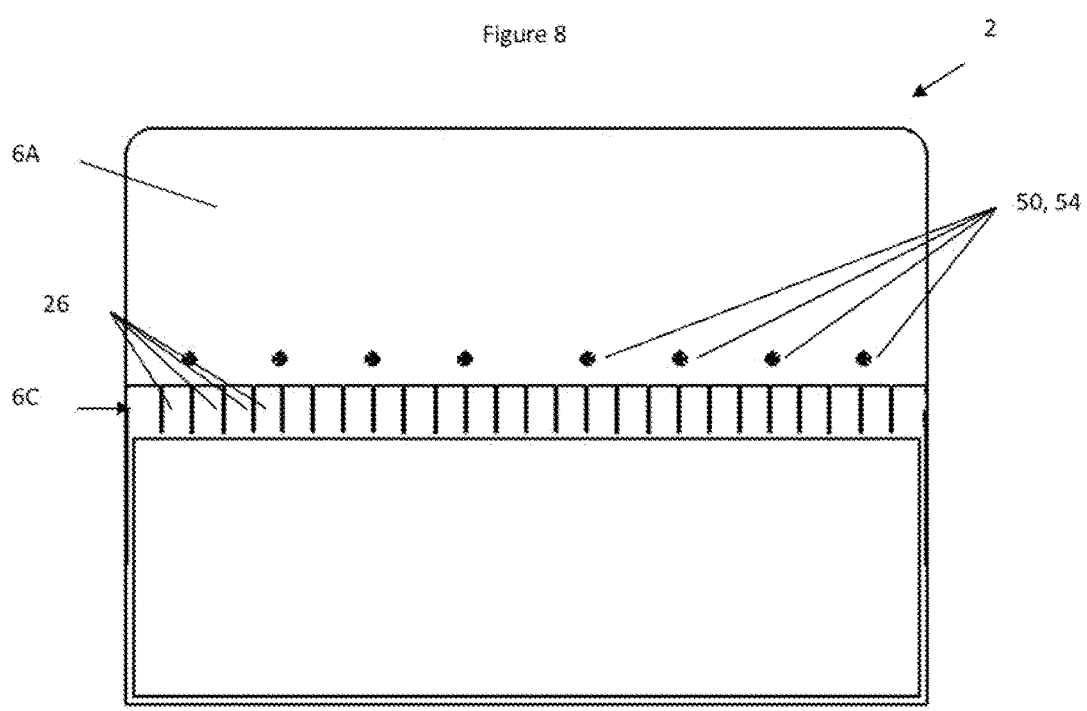
FIG. 9 illustrates a support portion having fastener supports within the support portion.

FIG. 9 illustrates a top view of another example of a solar module 2 having a plurality of fastener locations 50 with fastener supports 54 in the overlap support portion 6A at a distance from the intermediate portion 6C. The intermediate portion 6C includes a plurality of Intermediate reinforcement ribs 26 that extend along the intermediate portion 6C.

Figure 10A:
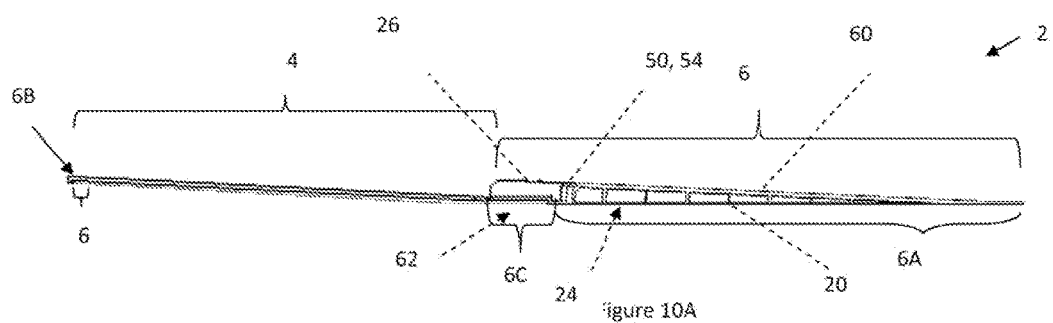
FIGS. 10A-10C illustrate cross-sectional views of the solar modules of the teachings herein.
Figure 10B:
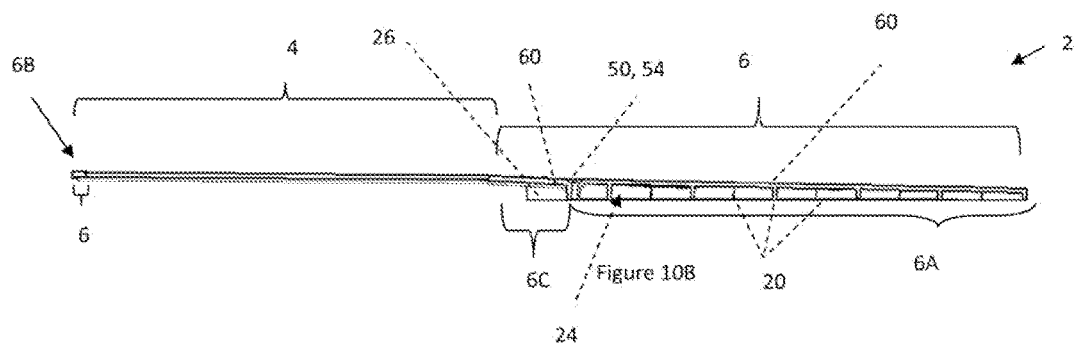
Figure 10C:
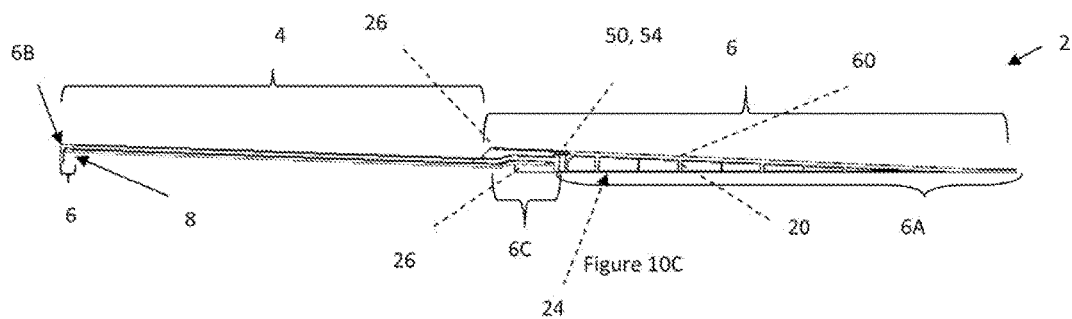

FIGS. 10A-10C illustrate cross-sectional views of the solar modules 2 as taught herein. Each of the solar modules 2 include a support portion 6 with an active portion 4 therebetween. The active portion 4 includes a frame support portion 6B on an end of the active portion 4 with the support portion 6 including the overlap support portion 6A and intermediate portion 6C on the opposing side. A fastener location 50 having a fastener support 54 is illustrated between the intermediate portion 6C and the overlap support portion 6A. A gap 24 is present between each of the reinforcement ribs 20 so that the bottom of the upper surface 60 is exposed.

FIG. 10A illustrates the active portion 4 being connected to the intermediate portion 6C at a lower surface 62. The intermediate portion 6C includes an Intermediate reinforcement rib 26 that extends from the lower surface 62. The overlap support portion 6A includes a plurality of reinforcement ribs 20 extending from an upper surface 60.

FIG. 10B illustrates the active portion 4 forming a connection with the intermediate portion 6C along a top of the intermediate portion 6C. The intermediate portion 6C includes intermediate reinforcing ribs 26 connected to the upper surface 60 and extending along a bottom side of the intermediate portion 6C. The overlap support portion 6A includes a plurality of reinforcing ribs 20 extending from the upper surface 60.

FIG. 10OC illustrates the frame support portion 66 including a lip 8 that extends over a portion of an adjacent solar module (not shown). The intermediate portion 6C includes the active portion 4 that extends to a middle part so that intermediate reinforcement ribs 26 extend above the active portion 4 and the intermediate reinforcement ribs 26 extend below the active portion 4. The overlap support portion 6A includes a plurality of reinforcing ribs 20 extending from the upper surface 60.

Figure 11:
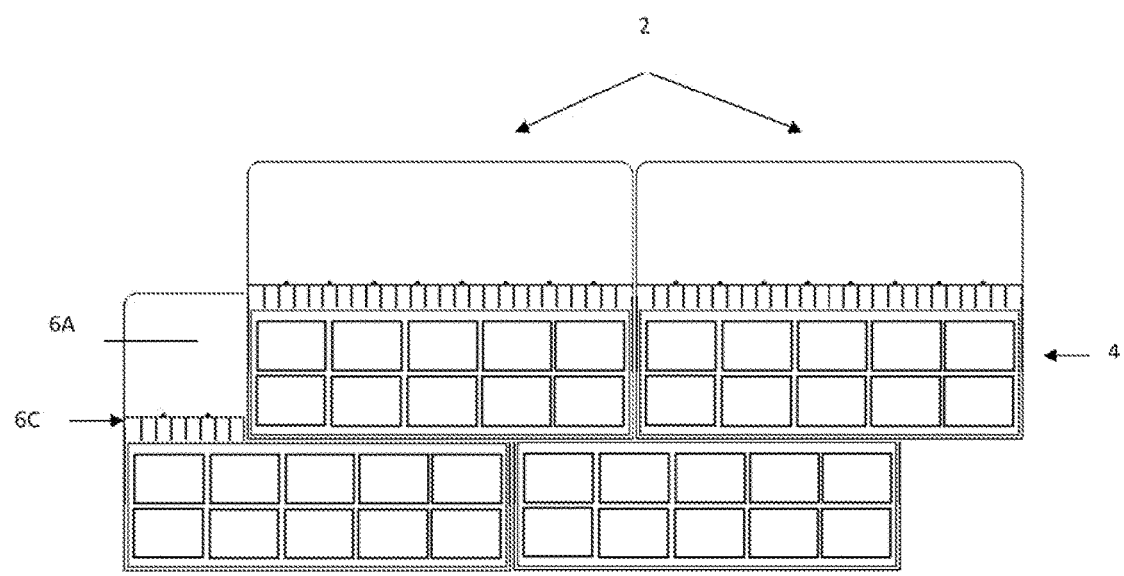
FIG. 11 illustrates overlapped solar modules forming a partial solar array.

FIG. 11 illustrates a partial solar array of solar modules 2. The active portion 4 of a solar module extends over the overlap support portion 6A and intermediate portion 6C of one more adjacent solar modules so that a shingle configuration is created.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes. The term "consisting essentially of" to describe a combination shall include the elements, ingredients, components or steps identified, and such other elements ingredients, components or steps that do not materially affect the basic and novel characteristics of the combination. The use of the terms "comprising" or "including" to describe combinations of elements, ingredients, components or steps herein also contemplates embodiments that consist essentially of the elements, ingredients, components or steps. By use of the term "may" herein, it is intended that any described attributes that "may" be included are optional.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps.

It is understood that the above description is intended to be illustrative and not restrictive. Many embodiments as well as many applications besides the examples provided will be apparent to those of skill in the art upon reading the above description. The scope of the teachings should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. The omission in the following claims of any aspect of subject matter that is disclosed herein is not a disclaimer of such subject matter, nor should it be regarded that the inventors did not consider such subject matter to be part of the disclosed inventive subject matter.

We claim:

1. A solar module comprising:
   a. an active portion that supports one or more photovoltaic elements; and
   b. a support portion formed integrally with the active portion such that the support portion and the active portion are oriented in a plane, the support portion comprising an intermediate portion and an overlap portion,
   wherein the support portion and the active portion each comprise:
      i. an upper surface,
      ii. a lower surface,
      iii. or both;
   wherein the upper surface or the lower surface of the support portion includes:
      a plurality of reinforcement ribs, wherein the plurality of reinforcement ribs are a series of interconnected closed patterns, a plurality of partially interconnected closed patterns, or a combination thereof so that a series of reinforcement ribs substantially cover the support portion; and
   wherein:
   A. the intermediate portion is positioned between the overlap portion and the active portion and acts as a structural interface between the active portion and the overlap portion, and wherein the intermediate portion includes one or more gate locations;
   B. the plurality of reinforcement ribs extend at an angle along the support portion so that an effective modulus of the support portion along a width direction is substantially equal to an effective modulus of the support portion along a length direction; and
   C. the active portion has a length that is measured from an edge proximate to the intermediate portion to an opposing edge of the active portion, the support portion having a length that is measured from an edge of the intermediate portion proximate to the active portion to an opposing edge of the overlap portion, and the length of the overlap portion plus the intermediate portion is substantially the same as or greater than the length of the active portion.

2. The solar module of claim 1, wherein the plurality of reinforcement ribs substantially cover the lower surface, the upper surface, or both of the support portion, and the plurality of reinforcement ribs extend at angles relative to one another and at angles relative to both a width and the length of the support portion.

3. The solar module of claim 1, wherein the intermediate portion includes a plurality of intermediate reinforcement ribs that extend along the intermediate potion.

4. The solar module of claim 1, wherein the support portion is made of a polymeric composition.

5. The solar module of claim 4, wherein the support portion includes fibers oriented generally along a first direction; and
   wherein the reinforcement ribs include fibers oriented along a second direction, wherein the second direction is different than the first direction.

6. The solar module of claim 5, wherein the second direction is substantially perpendicular to the first direction.

7. The solar module of claim 1, wherein the support portion includes: an additional series of gate locations that extend across a width of the overlap portion; and
   the active portion includes a frame support portion that extends at least partially around the photovoltaic elements and/or includes an additional series of gate locations; or both.

8. The solar module of claim 1, wherein one or more of the one or more reinforcement ribs include a rib depression so that the one or more reinforcement ribs at the rib depression are free of contact with an opposing roofing structure, water may pass over and/or through the rib depressions, or both.

9. The solar module of claim 1, wherein the intermediate portion extends from a top end of the active portion.

10. The solar module of claim 1, wherein the overlap portion includes only the upper surface and is free of the lower surface.

11. The solar module of claim 1, wherein a thickness of the upper surface or the lower surface of the intermediate portion is greater than a thickness of the upper surface or the lower surface of the overlap portion.

12. The solar module of claim 1, wherein both the overlap portion and the intermediate portion include reinforcement ribs and the reinforcement ribs are connected to an upper surface of the overlap support portion and a lower surface of the intermediate portion, or vice versa, and wherein the upper surface of the overlap portion is the lower surface of the intermediate portion or vice versa.

13. A solar array comprising:
 a plurality of the solar modules of claim 1, wherein the overlap portion and the intermediate portion of a solar module are covered by one or more adjacent solar modules.

14. A method of producing the solar module of claim 1, wherein producing the support portion comprises:
 a. injecting a polymeric composition into a mold at locations corresponding to the one or more gate locations so that the polymeric composition spreads out and forms the support portion and
 b. wherein the support portion forms a frame around the active portion.

15. The method of claim 14, wherein the polymeric composition includes fibers and the fibers during injection are oriented by the one or more reinforcement ribs.

16. The method of claim 14, wherein the reinforcement ribs disrupt a flow path of the polymeric composition during the step of injecting so that the reinforcement ribs guide flow of the polymeric composition to a predetermined location, align the flow of the polymeric composition at a predetermined orientation, change flow of the polymeric composition to have a different direction of flow in the upper surface or the lower surface, or a combination thereof.

* * * * *